United States Patent
Lin et al.

(10) Patent No.: US 7,843,116 B2
(45) Date of Patent: Nov. 30, 2010

(54) PLASMA DISPLAY PANEL THERMAL DISSIPATION APPARATUS AND METHOD

(75) Inventors: Yu-Kai Lin, Taisi Township, Yunlin County (TW); Jiun-Han Wu, Sanchong (TW); Yao-Ching Su, Taoyuan (TW); Po-Cheng Chen, Yonghe (TW)

(73) Assignee: AU Optronics Corporation (TW)

( * ) Notice: Subject to any disclaimer, the term of this patent is extended or adjusted under 35 U.S.C. 154(b) by 1029 days.

(21) Appl. No.: 11/034,970

(22) Filed: Jan. 14, 2005

(65) Prior Publication Data

US 2006/0158835 A1    Jul. 20, 2006

(51) Int. Cl.
G06F 1/16     (2006.01)
H05K 7/20    (2006.01)

(52) U.S. Cl. .................. 313/46; 361/681; 361/688; 445/24; 445/25; 313/582; 313/583; 313/584; 313/586; 313/587

(58) Field of Classification Search .............. 313/46, 313/582–587, 204; 345/30, 37, 60; 361/681, 361/688, 704, 752, 748; 445/24–25; 315/169.3, 315/169.4
See application file for complete search history.

(56) References Cited

U.S. PATENT DOCUMENTS

| | | | | |
|---|---|---|---|---|
| 6,104,619 A | * | 8/2000 | Shigehiro | 361/749 |
| 6,703,702 B2 | | 3/2004 | Inoue et al. | |
| 6,774,872 B1 | * | 8/2004 | Kawada et al. | 345/60 |
| 7,218,521 B2 | | 5/2007 | Kim | |
| 2001/0033009 A1 | * | 10/2001 | Inoue et al. | 257/668 |
| 2002/0067591 A1 | * | 6/2002 | Tajima | 361/681 |
| 2003/0020152 A1 | * | 1/2003 | Inoue et al. | 257/684 |
| 2003/0058230 A1 | * | 3/2003 | Ide | 345/204 |
| 2004/0183484 A1 | * | 9/2004 | Ide et al. | 315/366 |
| 2005/0088071 A1 | * | 4/2005 | Ahn et al. | 313/46 |
| 2005/0088092 A1 | * | 4/2005 | Kim et al. | 313/582 |

FOREIGN PATENT DOCUMENTS

CN      1665383        9/2005

OTHER PUBLICATIONS

Office Action of its corresponding Chinese patent application issued on Jul. 6, 2007.

* cited by examiner

*Primary Examiner*—Bumsuk Won
*Assistant Examiner*—Elmito Breval
(74) *Attorney, Agent, or Firm*—Arent Fox LLP

(57) ABSTRACT

A Plasma Display Panel (PDP) apparatus, system and method, includes a circuit framework structure, chassis structure, panel structure, TCP structure, at least one thermal pad structure and an insulating structure. An integrated circuit is coupled to at least one thermal pad structure and the TCP structure, and the circuit framework structure is disposed external to the TCP structure. Therefore, efficient dissipation of heat that is generated during operation of the PDP structures may be obtained. In addition, the amount of accumulated heat in the PDP structure may be significantly reduced due the PDP apparatus and structure configuration, thereby increasing the PDP operational life.

19 Claims, 3 Drawing Sheets

PLASMA DISPLAY PANEL THERMAL DISSIPATION APPARATUS AND METHOD

BACKGROUND OF THE INVENTION

1. Field of the Invention

The present invention relates to the field of flat-panel displays. More particularly, the present invention relates to plasma display panel (PDP) technology, along with associated methods of heat dissipation and thermal management.

2. Description of the Related Art

Traditionally, various electronic devices have utilized heat sink devices, either integrally configured or attached thereto, to dissipate heat in thermally deleterious heat generating components of such electronic devices. The same is true for flat-panel display modules, such as liquid crystal displays (LCDs) and PDPs, which generate enormous quantities of heat. Various methods have been utilized that relatively inefficiently dissipate the heat generated in PDP structures including integrated circuits (ICs).

Tape carrier packages (TCPs) are packages in which ICs are installed on thermally stable substrates and sealed with polymer. TCPs are widely used in liquid crystal drivers and less frequently in PDPs. However, there are several disadvantages associated with methods used for TCPs. In addition, the TCP structure itself increases device weight and dimensional thickness. These characteristics inevitably limit the PDP's ability to efficiently dissipate heat.

Various ICs can operationally endure temperatures as high as 85°-100° C. However, high temperatures can adversely impact performance characteristics of a PDP. Therefore, there is a present need to reduce the operational working temperature of the PDP and associated ICs, without increasing costs, to reach the appropriate thermal balance in a display panel.

FIG. 1 illustrates a conventional structure of a PDP 100. An IC 101 is coupled to a conventional TCP 102 attached to the PDP 100, and a printed circuit board (PCB) 103 is disposed partially within the TCP 102. The PDP 100 is coupled to a chassis/base plate structure 104 by attachment fasteners 105. The PDP 100 has a panel structure 106, consisting of a front panel 106a and a rear panel 106b. A thermal pad 107 is disposed between the rear panel 106b and the chassis/base plate 104.

Heat generated by the structures FIG. 1, including the PDP 100, IC 101 and panel structures 106, is dissipated by conventional means of thermal conduction and convection, which is relatively inefficient. This generated heat is inhibited from dissipation by the structural barrier of the TCP 102. This source of heat in area "A" is a result of the natural inter-flow that comes from the panel structure 106 and its driving IC 101. The heat generated accumulates in area A (direction as shown by the arrows if FIG. 1), thus making it even more difficult to discharge heat generated by the driver IC 101. Also, the linear width dimension ($\Delta 1$) of the TCP 102 affects the amount of heat that can be effectively dissipated from the PDP 100.

Clearly, conventional PDP structures associated with TCPs have several disadvantages regarding heat dissipation. There is no heat dissipation structure provided in the TCP's driver or in the overall mechanical packaging of the TCP module. Thus, when applied to a PDP, the TCP is not able to effectively dissipate heat generated by the IC. As a result, at least the operating life of the PDP is shortened, and worse, the excess heat may result in the destruction of the IC itself.

One of the most significant threats to the operational performance and lifetime of a conventional PDP lies in deleterious thermal environments caused by generated heat. Thus, there is a present need for an apparatus and method that prevents the compromised or operational failure of a PDP panel by reducing heat accumulation while increasing the heat dissipation efficiency of the overall PDP structure. Moreover, the present need extends to a solution that reduces an operational working temperature of a PDP and associated ICs without increasing costs to reach an appropriate thermal balance in the operational display.

SUMMARY OF THE INVENTION

The present invention is therefore directed to a plasma display panel thermal dissipation apparatus, system, and method, which substantially overcome one or more of the problems due to the limitations and disadvantages of the related art.

It is a feature of an embodiment of the present invention to provide a robust, versatile and cost-effective solution to both generation and heat dissipation of associated PDP structures and assemblies.

It is another feature of an embodiment of the present invention to provide a plasma display panel thermal dissipation apparatus, system, and method for enhancing the thermal management characteristics of a PDP by conducting heat away from ICs of the PDP and reducing heat accumulation within the PDP.

It is another feature of an embodiment of the present invention to permit the efficient dissipation of deleterious heat that is generated during PDP operation of the ICs and associated TCP structures.

It is another feature of an embodiment of the present invention to reduce accumulated heat generated within a PDP structure, thus preventing a reduction in the PDP operational life.

It is another feature of an embodiment of the present invention to reduce thermal dissipation inefficiency of a PDP.

It is another feature of an embodiment of the present invention to reduce operational temperature of an IC of a PDP without increasing costs or dimensional thinness.

At least one of the above and other features and advantages of the present invention may be realized by providing a plasma display panel thermal dissipation apparatus, system, and/or method, in which a PDP structure is disposed external to a TCP structure, such that generated heat does not accumulate within the TCP structure and is conducted away from an integrated circuit (IC). Preferably, at least one thermal pad structure is provided as a thermal conduit for generated heat. The thermal pad structure may be attached to a panel structure and/or IC of the PDP.

Preferably, at least one thermal pad structure is directly thermally coupled to the IC, irrespective of whether the IC is disposed internally or externally to the TCP structure.

In addition, the IC location and TCP configuration relative to the associated PDP structures is preferably modified over that of the related art.

As a result, the present invention provides more efficient plasma display panel thermal dissipation compared to that of the related art.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
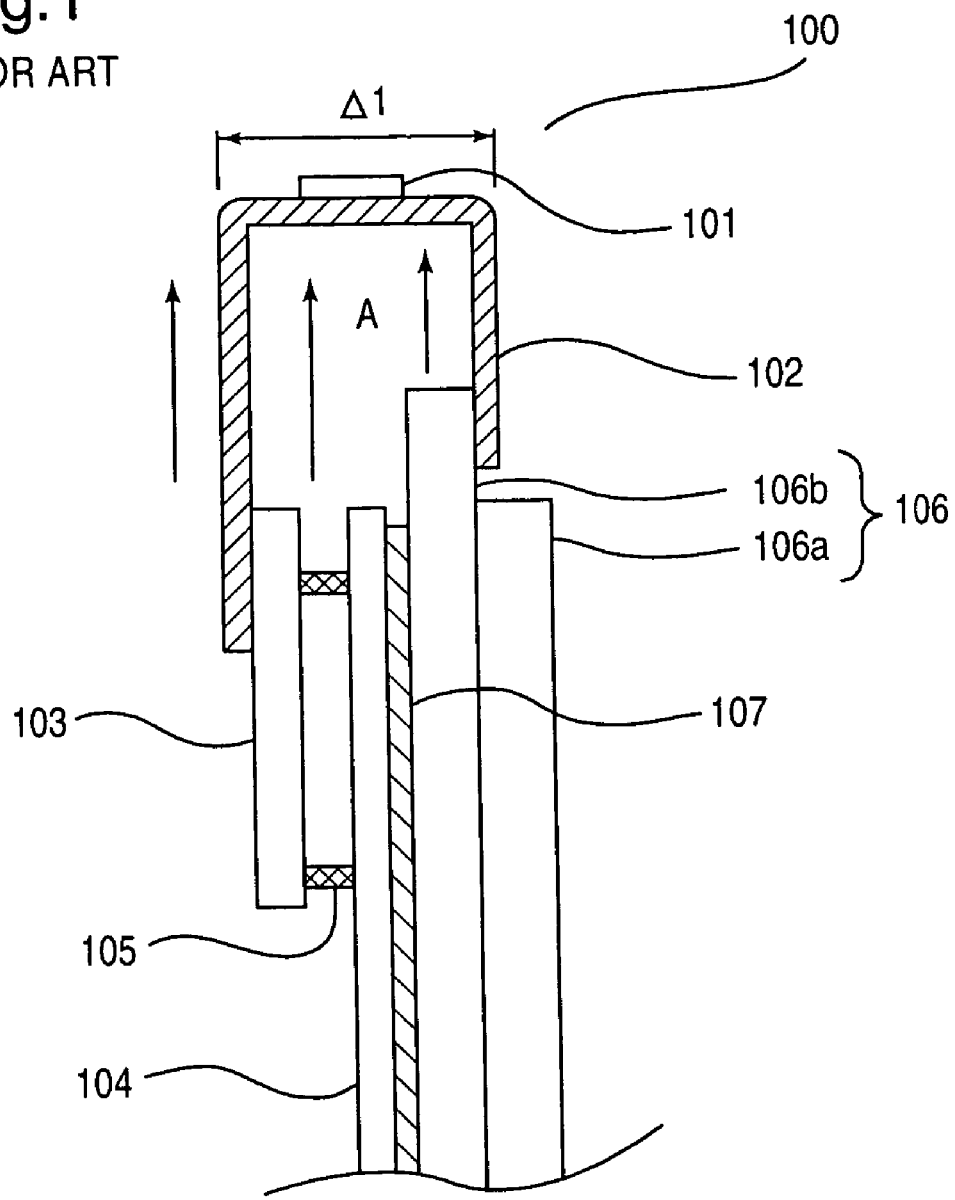
FIG. 1 illustrates a cross-sectional view of a conventional PDP with conventional IC and TCP structures.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The following section describes various embodiments of the present invention based on drawings, while exemplifying the PDP thermal dissipation and equilibration apparatus, system and method of the present invention.

Figure 2:
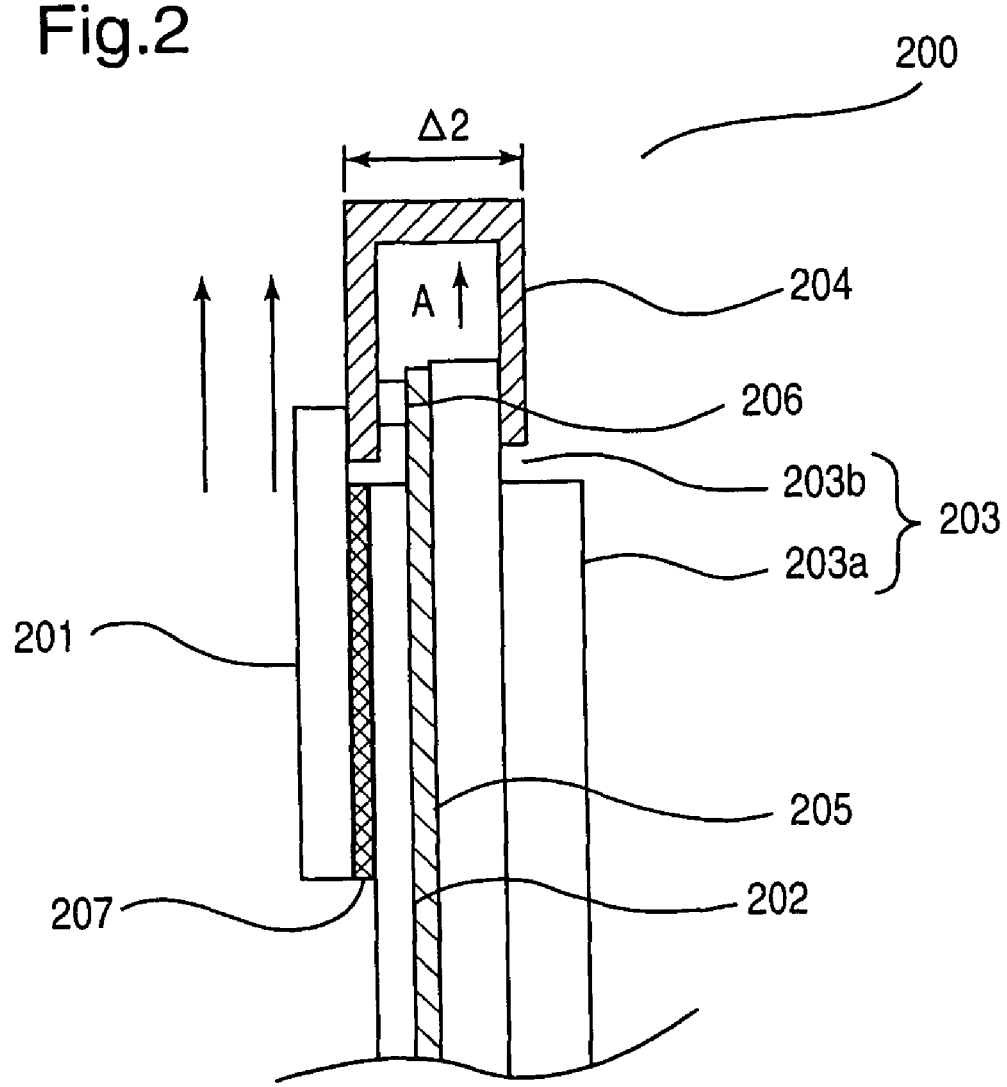
FIG. 2 illustrates a cross-sectional view of a PDP structure according to an embodiment of the present invention.

Accordingly, FIG. 2 illustrates an embodiment of a PDP 200 apparatus of the present invention. A circuit framework structure 201, which may include a printed circuit board (PCB) and control circuit components, along with a chassis structure 202, a panel structure 203 and a tape carrier package (TCP) structure 204 are provided. It should be noted that the panel structure 203 may include a single integrated unit or a plurality of units, e.g., front 203a and back 203b panels. The TCP structure 204 is coupled to the framework structure 201 and the panel structure 203, along with at least one thermal pad structure 205, wherein the at least one thermal pad structure 205 is disposed between the chassis structure 202 and the panel structure 203. A PDP driver integrated circuit (IC) 206 is coupled to at least one thermal pad structure 205 and the TCP structure 204, internal to the TCP structure 204. An insulating structure 207 is coupled to and disposed between the framework structure 201 and chassis structure 202. The insulating structure 207 electrically insulates the circuit framework structure 201 from the chassis structure 202.

In this embodiment of the present invention, the framework structure 201, insulating structure 207, chassis structure 202, at least one thermal pad structure 205, and the panel structure 203 are coupled together. It should also be noted that according to the present invention, the structures of the PDP 200 may be coupled by various means, e.g., securing screws, adhesive layers, etc.

There are several aspects of the present invention that are to be noted. The IC 206 attached to the TCP structure 204 is coupled to the panel structure 203 using a thermal pad structure 205 that efficiently dispenses operationally generated heat. The PDP structure 200 of the present invention effectively separates the thermal inter-flow from the panel 203 and its driving integrated circuit IC 206.

According to the present invention, the positioning of the framework structure 201 external to the TCP structure 204 provides for the significant reduction of the accumulation of PDP 200 operationally generated heat. Thus, by the present invention, the thermal dissipation efficiency of the PDP may be significantly increased.

More specifically, due to the natural inter-flow that comes from the panel 203 and its driving integrated circuit 206, generated heat accumulates in area A. However, according to the present invention, the TCP structure 204 and panel structure 203 are configured such that the heat in area A from the driving IC 206 of the panel is reduced. Moreover, the linear width dimension ($\Delta 2$) is thinner than the conventional TCP dimension ($\Delta 1$), as referenced in FIG. 1, e.g., ($\Delta 2 < \Delta 1$, $\Delta 2 \leq 20$ mm).

In addition, the thermal pad structure 205 is attached to both the IC 206 and the chassis structure 202. The circuit framework structure 201 is coupled to the insulating structure 207, thus permitting the heat generated by the framework structure 201 to be dissipated more efficiently, without being inhibited by the TCP structure 204.

Further, in the embodiment of the present invention illustrated in FIG. 2, the chassis structure 202 does not extend into the TCP structure 204, beyond where the TCP is coupled to the circuit framework structure 201. The circuit framework structure 201 may include a PCB, along with several control circuit components that are attached to the PDP 200. The chassis structure 202 is coupled to and disposed between the thermal pad structure 205 and the insulating structure 207. It should be noted that the thermal pad structure 205 is disposed between the chassis structure 202 and the panel structure 203. Therefore, in order to accomplish an advantage of the present invention, this embodiment permits the operationally generated heat from the panel 203 to be transferred through the thermal pad structure 205, while reducing the amount of heat accumulated in area A of the TCP 204. Thus, the PDP 200 will be less susceptible to thermally induced fractures and operational failures or degradations.

Figure 3:
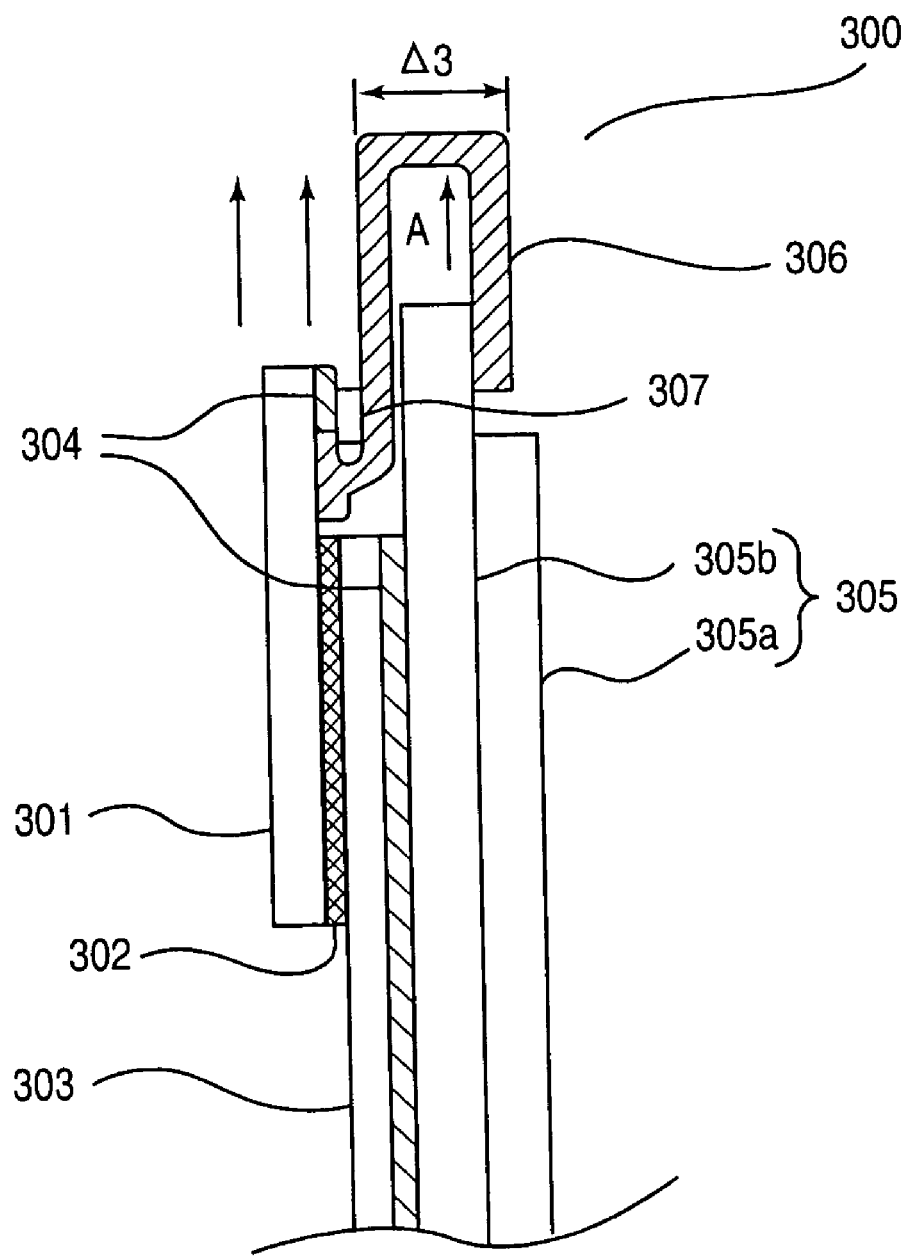
FIG. 3 illustrates a cross-sectional view of a PDP structure according to another embodiment of the present invention.

FIG. 3 illustrates an alternate embodiment of the present invention. The embodiment illustrated in FIG. 3 includes a PDP 300 having a circuit framework structure 301, which may include a PCB, along with various control circuit parts, coupled to an insulating structure 302. The insulating structure 302 is coupled to a chassis structure 303, which is coupled to a thermal pad structure 304 attached to a back of a panel structure 305. In this embodiment, a portion of the panel structure 305 extends into a TCP structure 306. However, an IC 307 is disposed external to the TCP structure 306 permitting more efficient heat dissipation, given that the circuit framework structure 301 is similarly disposed external to the TCP structure 306, in contradistinction to the conventional configurations. Further, the IC 307 is thermally coupled to at least one thermal pad structure 304, which is, itself, coupled to the circuit framework structure 301. Thus, the IC 307 attached to the TCP structure 306 can be connected to a PCB, for example, using the thermal pad structure 304, which efficiently dispenses operationally generated heat and provides for mechanical dissipation of externally imposed stresses on the PDP structure 300 overall.

Moreover, as illustrated in FIG. 3, heat that accumulates in area A is a result of the natural inter-flow that comes only from the panel structure 305, which includes a front 305a and rear panel 305b. According to the present invention, the TCP structure 306 and panel structure 305 are configured such that the heat in area A from the panel's driving IC 307 is reduced even more, as compared to a conventional PDP. Moreover, the linear width dimension ($\Delta 3$) is thinner than the conventional TCP dimension ($\Delta 1$), as referenced in FIG. 1, e.g., ($\Delta 3 < \Delta 1$, $\Delta 3 \leq 15$ mm).

According to the present invention, the thermal pad structure, utilizing resilient, low hardness, pliable materials, which are attached to the IC, prevent damage to the IC as a result of external mechanical forces being applied to the PDP structure. This is a significant advantage over a conventional attachment of the IC only to a PDP structure, such as the TCP alone.

Those skilled in the art will recognize that the device and methods of the present invention has many applications, and that the present invention is not limited to the representative examples disclosed herein. Although illustrative, the embodiments disclosed herein have a wide range of modification, change and substitution that is intended and in some instances some features of the present invention may be employed without a corresponding use of the other features.

Moreover, the scope of the present invention covers conventionally known variations and modifications to the system components described herein, as would be known by those skilled in the art. Accordingly, it is appropriate that the appended claims be construed broadly and in a manner consistent with the scope of the invention.

What is claimed is:

1. A plasma display panel thermal dissipation apparatus, comprising:
    a circuit framework structure;
    a chassis structure coupled to the circuit framework structure;
    a panel structure coupled to the chassis structure, the panel structure having a viewing surface;
    a tape carrier package structure coupled to the circuit framework structure and the panel structure, wherein the tape carrier package structure comprises an external portion and an internal portion, and wherein the internal portion faces an inner space;
    a thermal pad structure; and
    an integrated circuit, wherein the integrated circuit is coupled to the thermal pad structure and the tape carrier package structure, and
    wherein the circuit framework structure is disposed on the external portion of the tape carrier package structure, and wherein the chassis structure is disposed entirely external the tape carrier package structure in a longitudinal direction, the longitudinal direction being perpendicular to the viewing surface of the panel structure.

2. The plasma display panel thermal dissipation apparatus according to claim 1, wherein the thermal pad structure extends to a position internal to the tape carrier package structure.

3. The plasma display panel thermal dissipation apparatus according to claim 2, wherein the integrated circuit is disposed between the tape carrier package structure and the thermal pad structure in a position internal to the tape carrier package structure.

4. The plasma display panel thermal dissipation apparatus according to claim 1, wherein the thermal pad structure is disposed to be entirely external to the tape carrier package structure.

5. The plasma display panel thermal dissipation apparatus according to claim 4, wherein the thermal pad structure is disposed externally to the tape carrier package structure, wherein the integrated circuit is disposed between the tape carrier package structure and the thermal pad structure.

6. The plasma display panel thermal dissipation apparatus according to claim 1, wherein the thermal pad structure is disposed externally to the tape carrier package structure, wherein the integrated circuit is disposed between the tape carrier package structure and the thermal pad structure.

7. The plasma display panel thermal dissipation apparatus according to claim 1, further comprising an insulating structure coupled to and disposed between the framework structure and the chassis structure.

8. The plasma display panel thermal dissipation method according to claim 1, wherein the TCP structure linear width dimension is $\leq 20$ mm.

9. A plasma display panel thermal dissipation method, comprising:
    providing a circuit framework structure;
    providing a chassis structure coupled to the circuit framework structure, wherein the chassis structure is disposed entirely external to a tape carrier package structure;
    providing a panel structure coupled to the chassis structure, the panel structure having a viewing surface;
    providing the tape carrier package structure coupled to the circuit framework structure and the panel structure, wherein the tape carrier package structure comprises an external portion and an internal portion, and wherein the internal portion faces an inner space;
    providing a thermal pad structure; and
    providing an integrated circuit coupled to the thermal pad structure and the tape carrier package structure,
        wherein the circuit framework structure is disposed on the external portion of the tape carrier package structure in a longitudinal direction, wherein the longitudinal direction is perpendicular to the viewing surface of the panel structure.

10. The plasma display panel thermal dissipation method according to claim 9,
    wherein the thermal pad structure extends to a position internal to the tape carrier package structure.

11. The plasma display panel thermal dissipation method according to claim 10, wherein the integrated circuit is disposed between the tape carrier package structure and the thermal pad structure in a position internal to the tape carrier package structure.

12. The plasma display panel thermal dissipation method according to claim 9, wherein the thermal pad structure is disposed to be entirely external to the tape carrier package structure.

13. The plasma display panel thermal dissipation method according to claim 12, further comprising:
    providing the thermal pad structure disposed externally to the tape carrier package structure, wherein the integrated circuit is disposed between the tape carrier package structure and the thermal pad structure.

14. The plasma display panel thermal dissipation method according to claim 9, further comprising:
    providing the thermal pad structure disposed externally to the tape carrier package structure, wherein the integrated circuit is disposed between the tape carrier package structure and the thermal pad structure.

15. The plasma display panel thermal dissipation method according to claim 9, further comprising an insulating structure coupled to and disposed between the framework structure and the chassis structure.

16. The plasma display panel thermal dissipation method according to claim 9, wherein the TCP structure linear width dimension is $\leq 20$ mm.

17. A display panel thermal dissipation apparatus, comprising:
    a circuit framework structure;
    a chassis structure;
    a panel structure coupled to the chassis structure, wherein the panel structure comprises a front panel and a back panel, and wherein the front panel and back panel are substantially disposed with respect to a longitudinal direction that is perpendicular to a normal direction of viewing the front panel;
    a tape carrier package structure coupled to the circuit framework structure and the panel structure; and
    an integrated circuit, wherein the integrated circuit is coupled to the tape carrier package structure, and wherein the chassis structure is not shielded by the tape carrier package structure along the normal direction which is perpendicular to the longitudinal direction.

18. A display panel thermal dissipation apparatus, comprising:
- a circuit framework structure;
- a chassis structure;
- a panel structure coupled to the chassis structure, wherein the panel structure is perpendicular to a normal direction of the viewing surface of the display panel;
- a tape carrier package structure coupled to the circuit framework structure and the panel structure; and
- an integrated circuit, wherein the integrated circuit is coupled to the tape carrier package structure, and
- wherein the chassis structure is not shielded by the tape carrier package structure along the normal direction.

19. A display panel thermal dissipation apparatus, comprising:
- a circuit framework structure;
- a chassis structure;
- a panel structure coupled to the chassis structure;
- a tape carrier package structure coupled to the circuit framework structure and the panel structure; and
- an integrated circuit, wherein the integrated circuit is coupled to the tape carrier package structure, and
- wherein the chassis structure is not covered by the tape carrier package in a normal viewing direction of the display panel.

* * * * *